(12) United States Patent
Nozawa et al.

(10) Patent No.: US 8,883,022 B2
(45) Date of Patent: Nov. 11, 2014

(54) MASK BLANK AND METHOD OF MANUFACTURING AN IMPRINTING MOLD

(75) Inventors: Osamu Nozawa, Shinjuku-ku (JP); Masahiro Hashimoto, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 141 days.

(21) Appl. No.: 13/641,220

(22) PCT Filed: Apr. 4, 2011

(86) PCT No.: PCT/JP2011/058508
§ 371 (c)(1),
(2), (4) Date: Jan. 15, 2013

(87) PCT Pub. No.: WO2011/129212
PCT Pub. Date: Oct. 20, 2011

(65) Prior Publication Data
US 2013/0105441 A1    May 2, 2013

(30) Foreign Application Priority Data
Apr. 16, 2010    (JP) ................. 2010-094679

(51) Int. Cl.
*B44C 1/22* (2006.01)
*C03C 15/00* (2006.01)
*C03C 25/68* (2006.01)
*C23F 1/00* (2006.01)
*G03F 7/00* (2006.01)
*G11B 5/855* (2006.01)

(52) U.S. Cl.
CPC .............. *G11B 5/855* (2013.01); *G03F 7/0015* (2013.01); *G03F 7/0002* (2013.01)
USPC .................................... 216/41; 216/37; 430/5

(58) Field of Classification Search
CPC .......... B82Y 10/00; B82Y 40/00; G03F 1/32; G03F 1/52; G03F 1/54
USPC .......................................... 216/41, 37; 430/5
See application file for complete search history.

(56) References Cited

U.S. PATENT DOCUMENTS

| | | | |
|---|---|---|---|
| 2003/0232252 A1 | 12/2003 | Mancini et al. | |
| 2007/0259276 A1* | 11/2007 | Yoshikawa et al. | 430/5 |
| 2010/0255411 A1 | 10/2010 | Sato et al. | |

FOREIGN PATENT DOCUMENTS

| | | |
|---|---|---|
| JP | 2005-530338 A | 10/2005 |
| JP | 2006-078825 A | 3/2006 |
| JP | 2009-098689 A | 5/2009 |
| WO | 2009/041551 A1 | 4/2009 |

* cited by examiner

*Primary Examiner* — Roberts Culbert
(74) *Attorney, Agent, or Firm* — Sughrue Mion, PLLC

(57) ABSTRACT

Provided is a mask blank which is used for manufacturing an imprinting mold and which may form a fine mold pattern with high pattern accuracy. A mask blank (10) includes a transparent substrate (1) and a thin film (2) contacted with a surface of the substrate. The thin film (2) includes a laminated film including an upper layer (4) which is composed of a material containing silicon (Si) or a material containing tantalum (Ta), and a lower layer (3) which is composed of a material containing at least one of hafnium (Hf) and zirconium (Zr) and containing substantially no oxygen.

3 Claims, 3 Drawing Sheets

MASK BLANK AND METHOD OF MANUFACTURING AN IMPRINTING MOLD

CROSS REFERENCE TO RELATED APPLICATIONS

This application is a National Stage of International Application No. PCT/JP2011/058508 filed Apr. 4, 2011, claiming priority based on Japanese Patent Application No. 2010-094679, filed Apr. 16, 2010, the contents of all of which are incorporated herein by reference in their entirety.

TECHNICAL FIELD

This invention relates to a method of manufacturing an imprinting mold (stamper) that is used in manufacturing an optical component which has an optical function provided by a fine pattern and/or an integrated circuit on a semiconductor or the like or that is used in forming a fine pattern on a magnetic disk. This invention also relates to a mask blank suitably used for the production of the imprinting mold.

BACKGROUND ART

Generally, in a production step of a semiconductor device, a fine pattern is formed using a photolithographic method. Further, in forming the fine pattern, a large number of substrates called photomasks are usually used. In a photomask, a light-shielding fine pattern of a metal thin film or the like is generally provided on a transparent glass substrate. The photolithographic method is also used in manufacturing this photomask.

The photomask and the imprinting mold (namely, imprinting mold) serve as an original plate for transferring the same fine pattern to a great number of objects. The dimensional accuracy of a pattern formed on the photomask directly affects the dimensional accuracy of the fine pattern to be manufactured. Further, the imprinting mold is adapted to transfer a pattern by pressing the imprinting mold directly against a resist film applied on a transfer object, and thus, the shape in section of the pattern further seriously influences the shape of the fine pattern to be manufactured. With an increase in degree of integration of a semiconductor circuit, the dimensions of the pattern become smaller, and a higher accuracy or precision of the photomask or the imprinting mold is required. In particular, the imprinting mold adopts a transfer method by pressing the mold directly against the object as described above and the pattern is transferred at the same size, and thus, the required accuracy should be the same as the accuracy of the semiconductor circuit pattern. Therefore, the imprinting mold should be manufactured more accurately than a photomask.

In manufacturing a conventional imprinting mold, a mask blank is used which comprises a transparent substrate such as quartz glass and a thin film of chromium or the like formed thereon. After a resist is applied on the mask blank, a resist pattern is formed by using electron beam exposure or the like. By etching the thin film by using the resist pattern as the mask, a thin film pattern (mask pattern) is formed.

Further, with regard to an imprinting mold used for a transfer object on which a photo-curable resin is applied, for the purpose of applying light in transfer, a transparent substrate is etched with a thin film pattern used as the mask to manufacture a step pattern. In this case also, the dimensions and the accuracy of the pattern of the transparent substrate are directly affected by the dimensions and the accuracy of the thin film pattern. Therefore, in order to finally manufacture an imprinting mold having a highly accurate fine pattern formed thereon, it is necessary to form the thin film pattern in the mask blank with high pattern accuracy.

For example, as means for etching a thin film containing chromium or the like, wet etching using di-ammonium cerium(IV) nitrate or dry etching using a mixed gas of a chlorine-based gas and oxygen is ordinarily used.

Conventionally, there are known a method in which a thin film pattern including a plurality of layers is formed using multistage etching for the purpose of improving nonuniformity in width and depth of etching of a chromium film (Patent Document 1), and another method in which a thin film pattern is formed by using a resist pattern as the mask and, then, the thin film pattern thus formed is used as a mask to form a next thin film pattern of second and subsequent layers, in order to make it possible to thin a resist (Patent Document 2).

In the meanwhile, in a magnetic disk to be mounted to a magnetic recording device such as a hard disk drive (HDD), use has conventionally been made of a technique in which a higher density is sought by minimizing the width of a magnetic head and narrowing a space between data tracks in which information is recorded. However, the conventional technique has reached the limit in achieving a higher density, and magnetic effect between adjacent tracks and thermal fluctuation phenomena are no longer negligible. In recent years, a proposal has been offered about a new type of medium called Discrete Track Recording Medium (hereinafter referred to as a DTR medium) in which data tracks of a magnetic disk are formed so as to be magnetically separated.

The above-mentioned DTR medium seeks to improve the signal quality by removing a portion of a magnetic material which is unnecessary for recording (forming a groove). Further, after forming a groove, the groove is filled with a non-magnetic material to realize surface flatness at the angstrom level which is required for a magnetic disk drive. As one of techniques of forming the groove having a fine width, an imprinting technology is used.

Further, proposal has also been made of another new type of medium called a patterned medium (a medium in which a signal is recorded as a dot pattern), which is an advanced type of DTR medium with a further higher density. In forming a pattern for the patterned medium, also, the imprinting technology is promising.

PRIOR ART DOCUMENT

Patent Document

Patent Document 1: JP-A-2005-530338
Patent Document 2: JP-A-2006-78825

SUMMARY OF THE INVENTION

Problem to be Solved by the Invention

As the degree of integration of a semiconductor circuit is improved, the dimensions of a pattern are required to become further finer. In the above-mentioned magnetic disk also, with regard to the imprinting mold (stamper) used for a DTR medium or a patterned medium, there is a strong demand for achievement of finer dimensions of the pattern. When the dimensions of the pattern are finer, for example, if the wet etching method is used, it is known that a problem arises in etching a chromium pattern. Specifically, with regard to the above-mentioned wet etching using di-ammonium cerium (IV) nitrate, there is an advantage that problems such as recess or disappearance of a resist do not often arise. On the other hand, there are problems that the shape in section of the chromium pattern is not vertical, that an etching bias occurs so that the chromium film is etched in a lateral direction of a section of the resist pattern, and the like.

On the other hand, with regard to dry etching using a mixed gas of, for example, chlorine and oxygen, there are problems such as recess or disappearance of a resist. However, as compared with the wet etching, the vertical shape in section of the chromium pattern may be obtained. Therefore, dry etching is advantageous in forming a fine pattern.

Further, when the dimensions of the pattern become finer, limitations are also imposed on the resist film thickness. Specifically, when the resist film thickness becomes approximately three times as large as the width of the pattern, there arise problems, such as a reduction of resolution appearing when the resist is exposed and collapse of the resist pattern and peeling of the resist after the pattern is formed. Thus, in order to form a fine pattern, it is desired that the resist film thickness be small. However, when, for example, the chromium pattern is formed by dry etching, the resist gradually disappears by the etching. Therefore, when the resist film thickness is too small, the resist disappears before completion of the formation of the chromium pattern and a portion of chromium which is not to be etched is also etched, and, as a result, the fine pattern cannot be formed.

It is noted here that, as a method for solving nonuniformity in width and depth of etching of a chromium film, a method is known in which a thin film pattern including a plurality of layers is formed using multistage etching as disclosed in Patent Document 1. In this method, nonuniformity in depth of etching is improved by an etching stopper. However, a method of preventing recess of the width of the resist which brings about nonuniformity in width of etching, a method of thinning the resist which is necessary in forming a fine pattern, and the like are not disclosed, and problems of the conventional technique in realizing a fine pattern have not been fully solved.

Further, as a method which is capable of thinning the resist, a method is known in which a thin film pattern is formed with a resist pattern used as a mask and, with the formed thin film pattern used as a mask, a next thin film pattern of second and subsequent layers is formed as disclosed in Patent Document 2. In this method, a chlorine-based gas containing oxygen is used as an etching gas used when the thin film is etched with the resist pattern used as the mask, but the etching progresses not only in a thickness direction but also in a lateral direction of a section of the resist during the dry etching and the resist pattern is recessed. As a result, there are cases in which the accuracy of the pattern obtained is not so satisfactory.

Further, problems in manufacturing an imprinting mold are not restricted, unlike the case of an ordinary photomask, to formation of the above-mentioned fine pattern. Specifically, in order that the mold may function as an imprinting mold used for transferring a pattern to a photo-curable resin, the thin film pattern (mask pattern) formed for etching the glass substrate must be finally removed. Therefore, whether dry processing is used or wet processing is used to remove such a thin film pattern, it is necessary to remove the thin film pattern so as not to damage the glass pattern after the removal. For this purpose, the thin film material on the glass substrate in a mask blank used for manufacturing the imprinting mold is required to be considered also from the viewpoint of being able to be removed (or peeled) easily by wet processing or dry processing so as not to finally damage at all the glass pattern.

Accordingly, this invention has been made in view of such conventional circumstances. The first object of this invention is to provide a mask blank which may form a fine mold pattern with high pattern accuracy in manufacturing an imprinting mold. The second object of this invention is to provide a method of manufacturing an imprinting mold, in which the mask blank is used to form a fine mold pattern with high accuracy and which is capable of removing a thin film pattern formed for the purpose of etching a substrate so as not to finally damage the mold pattern (glass pattern).

Means to Solve the Problem

In order to solve the above-mentioned problem, this invention has the following structures.

(Structure 1)

A mask blank comprising a thin film for forming a pattern formed on a transparent substrate, wherein the thin film is brought into contact with a surface of the transparent substrate and comprises a laminated film including at least an upper layer and a lower layer; the upper layer is made of a material containing silicon (Si) or a material containing tantalum (Ta); and the lower layer is made of a material that contains at least one of hafnium (Hf) and zirconium (Zr) and that contains substantially no oxygen.

(Structure 2)

A mask blank according to structure 1, wherein the material of the lower layer of the thin film further contains tantalum.

(Structure 3)

A mask blank according to structure 1 or 2, wherein the upper layer of the thin film is made of a material containing a transition metal and silicon.

(Structure 4)

A mask blank according to structure 1 or 2, wherein the upper layer of the thin film is made of a material that contains silicon and contains substantially no oxygen nor nitrogen, or a material that contains a transition metal and silicon and that contains substantially no oxygen nor nitrogen.

(Structure 5)

A mask blank according to any one of structure 1 to 4, wherein a thickness of the lower layer of the thin film falls within a range of not less than 5 nm and not more than 20 nm.

(Structure 6)

A mask blank according to any one of structures 1 to 5, wherein a thickness of the upper layer of the thin film falls within a range of not less than 2 nm and not more than 10 nm.

(Structure 7)

A method of manufacturing an imprinting mold, comprising etching the thin film in the mask blank according to any one of structures 1 to 6 to form a thin film pattern; etching the transparent substrate by using the thin film pattern as a mask to form a mold pattern; and, after formation of the mold pattern, removing the lower layer of the thin film by bringing the lower layer into contact with a substance which is kept in an unexcited state and which contains a compound of fluorine (F) and any one element of chlorine (Cl), bromine (Br), iodine (I), and xenon (Xe).

Effect of the Invention

According to this invention, it is possible to provide the mask blank which can form a fine mold pattern with high pattern accuracy in manufacturing an imprinting mold.

Further, according to this invention, it is possible to provide the method of manufacturing an imprinting mold, in which the mask blank is used to form a mold pattern with high accuracy and which is capable of removing a thin film pattern formed for the purpose of etching a substrate so as not to finally damage the mold pattern (glass pattern).

BEST MODE FOR EMBODYING THE INVENTION

Figure 1:
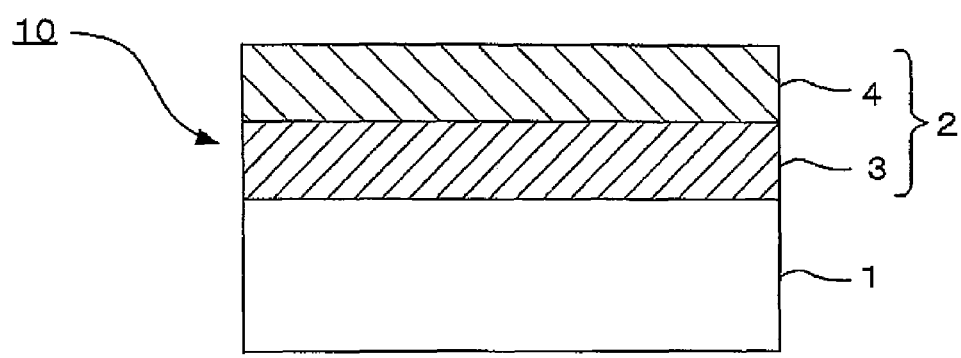
FIG. 1 is a schematic sectional view of a mask blank according to this invention.

Now, an embodiment of this invention will be described in detail with reference to the drawing as appropriate.

A mask blank according to this invention comprises a thin film for forming a pattern formed on a transparent substrate and is characterized in that the thin film is brought into contact with a surface of the transparent substrate and comprises a laminated film including at least an upper layer and a lower layer, that the upper layer includes a material containing silicon (Si) or a material containing tantalum (Ta) and the lower layer includes a material containing at least one of hafnium (Hf) and zirconium (Zr) and containing substantially no oxygen.

FIG. 1 is a schematic sectional view illustrating an embodiment of the above-mentioned mask blank according to this invention.

In the embodiment illustrated in FIG. 1, a mask blank 10 according to this invention includes a transparent substrate 1 and a thin film 2 formed thereon for forming a pattern. The thin film 2 is brought into contact with a surface of the transparent substrate 1. The illustrated thin film 2 is comprises a two-layer laminated film including an upper layer 4 and a lower layer 3.

Herein, as the transparent substrate 1 in the mask blank 10 according to this invention, a glass substrate such as quartz glass or $SiO_2$—$TiO_2$-based low expansion glass is generally used. These glass substrates are excellent in flatness and smoothness, and thus, when a pattern is transferred using an imprinting mold obtained according to this invention, the pattern may be transferred with high accuracy without distortion of the transferred pattern and the like.

The mask blank 10 according to this invention is suitable as a mask blank for dry etching, used for manufacturing an imprinting mold by patterning the thin film 2 and the transparent substrate 1 by dry etching.

In order to form a fine pattern, for example, a pattern having a half pitch (hp) of less than 32 nm with a high accuracy, there are problems, i.e., it is necessary to thin the resist, to suppress progress of the etching (recess of the resist) in a vertical direction of a section of the resist pattern (thickness direction of the resist pattern), and to suppress progress of the etching in a lateral direction of a section of the thin film pattern (isotropy of the etching). In case where the thin film pattern is formed by wet etching, etching inevitably advances in the lateral direction of a section of the thin film pattern. Therefore, dry etching is preferable for formation of a fine pattern.

When a thin film pattern is formed by dry etching, in order to thin a resist, there are methods, such as reducing the etching rate of the resist and shortening the etching time of the thin film to be patterned with the resist pattern used as the mask.

Conventionally, when dry etching of a mask blank including a thin film mainly containing chromium is carried out to manufacture an imprinting mold, a mixed gas of chlorine and oxygen is generally used as the etching gas. However, a resist generally has very low dry-etching resistance to an etching gas containing oxygen. This causes a problem. On the other hand, in dry etching using an etching gas which contains substantially no oxygen, progress of the etching in the vertical direction and the lateral direction of a section of the resist pattern is small in comparison with dry etching using a chlorine-based gas which contains oxygen. Therefore, consumption of the resist may be suppressed in the direction of a section of the resist during the etching and dimensional change of the resist can be suppressed. Accordingly, in this invention, as the dry etching of the upper layer 4 and the lower layer 3 of the thin film 2 in the mask blank 10, it is preferable to perform the dry etching using an etching gas containing substantially no oxygen. It is noted here that "an etching gas containing substantially no oxygen" means not only the case where no oxygen is contained at all but also the case where oxygen generated in the etching system is contained by the content of not more than 5 vol %.

Further, in order to shorten the etching time of the thin film 2 on the transparent substrate 1, there are a method of increasing the dry etching rate of the thin film for forming a pattern and a method of reducing a thickness of the thin film for forming a pattern. In manufacturing an imprinting mold, it is necessary to function the above-mentioned thin film as a hard mask layer (etching mask layer) when etching is carried out to form a fine pattern in the transparent substrate 1. Therefore, the thin film is required to have a certain thickness or more, and there are limitations in reducing the thickness of the thin film.

In view of the above, a material which has a high dry etching rate for an etching gas containing substantially no oxygen must be selected for at least the lower layer 3 of the thin film 2 (pattern formation layer). In the mask blank 10 according to this invention, the thin film 2 on the transparent substrate 1 comprises a laminated film including the upper layer 4 and the lower layer 3. The upper layer 4 of the thin film 2 has a function as a protective film which mainly prevents oxidation of the lower layer 3. In absence of such an upper layer, the surface of the lower layer is oxidized to form an oxide layer due to an atmospheric exposure of the layer, and the like. In this event, an etching rate of the lower layer in etching with the etching gas containing substantially no oxygen is significantly reduced and progress of the etching is prevented. Therefore, it is necessary to prevent oxidation of the lower layer.

Further, the lower layer 3 of the thin film 2 should have a function as a hard mask layer (etching mask) when dry etching of the transparent substrate (glass substrate) is carried out using a fluorine-based gas, and thus, is required to be resistant to dry etching using the fluorine-based gas. Further, it is preferable that the lower layer 3 has a high dry etching rate in etching using a gas containing substantially no oxygen, for example, a chlorine-based gas, and has sufficient resistance to cleaning. Moreover, it is desirable that the lower layer 3 has, in addition to the function as a hard mask layer, a function of assuring necessary conductivity in order to prevent charge-up in electron beam lithography in forming the resist pattern and in order to enable substrate pattern (mold pattern) inspection with a scanning electron microscope (SEM) which will be described later.

From the above-mentioned viewpoints, according to this invention, the lower layer 3 of the thin film 2 is formed of a material containing at least one of hafnium (Hf) and zirconium (Zr) and containing substantially no oxygen. Herein, "containing substantially no oxygen" means the case where no oxygen is contained at all and also the case where oxygen is contained but the content is less than 10 at %, and more preferably, not more than 5 at %. For example, as the material of the lower layer 3, at least one element of hafnium (Hf) and zirconium (Zr) or a compound thereof (for example, HfZr) may be selected, and further, a material containing the above-mentioned materials as a base material and an auxiliary material, for example, Ta, B, Ge, Nb, Si, or C added thereto may also be selected. These materials have excellent properties of high dry etching rate in etching using a chlorine-based gas containing substantially no oxygen and high resistance to etching using a fluorine-based gas. However, these materials also have properties that, once oxidation has advanced, not only dry etching is difficult for the fluorine-based gas but also the dry etching rate is extremely lowered and etching is difficult for the chlorine-based gas containing substantially no oxygen. Therefore, the upper layer 4 should be formed as a protective film for protection against progress of oxidation of the lower layer 23.

In this invention, as the material of the lower layer 3, a material containing at least one of hafnium and zirconium and further containing tantalum (for example, TaHf, TaZr, or TaHfZr) is particularly suitable. By containing tantalum in addition to hafnium or zirconium, the oxidation stability is further improved. The lower layer 3 of the thin film 2 should be finally removed after the transparent substrate (glass substrate) is etched to form the mold pattern (glass pattern). Under the circumstances, it is essential that the lower layer is removed without damaging the glass pattern. The above-mentioned material of the lower layer 3 may be easily removed without damaging the glass pattern by bringing the material into contact with a substance which is kept in an unexcited state and which contains a compound of fluorine (F) and any one element of chlorine (Cl), bromine (Br), iodine (I), and xenon (Xe).

The above-mentioned lower layer 3 mainly has a function as an etching mask layer. From this viewpoint, it is suitable that the thickness of the lower layer 3 falls within a range of not less than 5 nm and not more than 20 nm in this invention, although the thickness depends on the depth of a dug portion of the transparent substrate 1. If the thickness of the lower layer 3 is less than 5 nm, when the transparent substrate 1 is etched with the pattern of the lower layer used as the mask, the pattern of the lower layer may be etched and disappear before the etching is completed. On the other hand, the thickness of the lower layer 3 of more than 20 nm is not preferred from the viewpoint of forming the fine pattern.

According to this invention, the upper layer 4 of the thin film 2 is formed of a material containing silicon or a material containing tantalum. The material containing silicon may be a material containing a transition metal and silicon (transition metal is, for example, Mo, Ti, Ta, V, Zr, Hf, W, Ru, Rh, Ni, Zn, Nb, Pd, or Pt). Further, the material containing tantalum may be an elementary substance of Ta and Ta compounds such as TaX (where X is at least one of N, O, B, C, Ge, Nb, and V). It is preferable that the above-mentioned upper layer 4 achieves a high dry etching rate in etching using a gas containing substantially no oxygen, for example, a chlorine-based gas, and has sufficient resistance to cleaning. From these viewpoints, the material of the upper layer 4 may be a material containing silicon and containing substantially no oxygen nor nitrogen and a material containing a transition metal and silicon and containing substantially no oxygen nor nitrogen. "Containing substantially no oxygen nor nitrogen" as used herein means the case where oxygen and nitrogen are not at all contained and also the case where one or both of oxygen and nitrogen are contained but the content in total is 5 at % or less. Specifically, for example, MoSi, Si, SiX, and MoSiX (where X is at least one of Ti, V, Zr, Nb, Hf, W, and Ru) are preferable. In the case of a material containing silicon and a transition metal, from the viewpoint of providing oxidation resistance, it is preferable that the content of the transition metal be less than 50 at %.

It is noted here that the upper layer 4 is not particularly required to be resistant to dry etching using a fluorine-based gas used in patterning of the transparent substrate (glass substrate), which will be described later, and thus, no consideration is required about selection of a material from this viewpoint.

Further, the structure of the above-mentioned thin film 2 is a material structure which allows dry etching of the upper layer 4 and the lower layer 3 to be successively carried out by dry etching using the same chlorine-based gas with the resist pattern used as the mask. However, this invention is not limited to such a structure, but may have a structure such that, with the resist pattern used as the mask, dry etching of the upper layer 4 is carried out using a fluorine-based gas and dry etching of the lower layer 3 is carried out using a chlorine-based gas. As the material of the upper layer 4 of the thin film 2, a material containing the above-mentioned transition metal and silicon and further containing oxygen or nitrogen, a material containing tantalum and further containing oxygen, or the like is applied.

With regard to the upper layer 4 of the thin film 2, from the viewpoints of providing the function as a protective film for mainly preventing oxidation of the lower layer 3 and of forming the fine pattern, in this invention, it is suitable that the thickness falls within a range of not less than 2 nm and not more than 10 nm. The thickness of the upper layer 4 being less than 2 nm is not preferable because the above-mentioned function as a protective film for protecting the lower layer 3 from oxidation may not sufficiently be exhibited. On the other hand, the thickness of the upper layer 4 being more than 10 nm is not preferable because the required thickness of the resist film is increased when dry etching of both the upper layer 4 and the lower layer 3 is carried out using the same etching gas with the resist pattern used as the mask.

Further, it is necessary to secure the adherence of the upper layer 4 of the above-mentioned thin film 2 to the resist. When, depending on the material of the upper layer, the adherence to the resist is low as represented by a case of a Si-based material, the surface of the thin film may be treated using, for example, an adherence improver such as HMDS (hexamethyldisilazane).

No specific restriction is imposed on a method of forming, on the transparent substrate 1, the thin film 2 comprising a laminated film including the upper layer 4 and the lower layer 3. Among others, however, a sputtering film forming method is preferable. The sputtering film forming method is preferable because a uniform film of a constant thickness can be formed.

Further, the mask blank 10 according to this invention may comprise a resist film formed on the above-mentioned thin film 2.

Further, this invention also provides a method of manufacturing an imprinting mold using the above-mentioned mask blank 10.

Specifically, the method of manufacturing an imprinting mold is featured by including the steps of etching the thin film in the mask blank according to this invention to form a thin film pattern, etching the transparent substrate by using the thin film pattern as a mask to form a mold pattern, and, after formation of the mold pattern, removing the lower layer of the thin film by bringing the lower layer into contact with a substance which is kept in an unexcited state and which contains a compound of fluorine (F) and any one element of chlorine (Cl), bromine (Br), iodine (I), and xenon (Xe).

Figure 2:
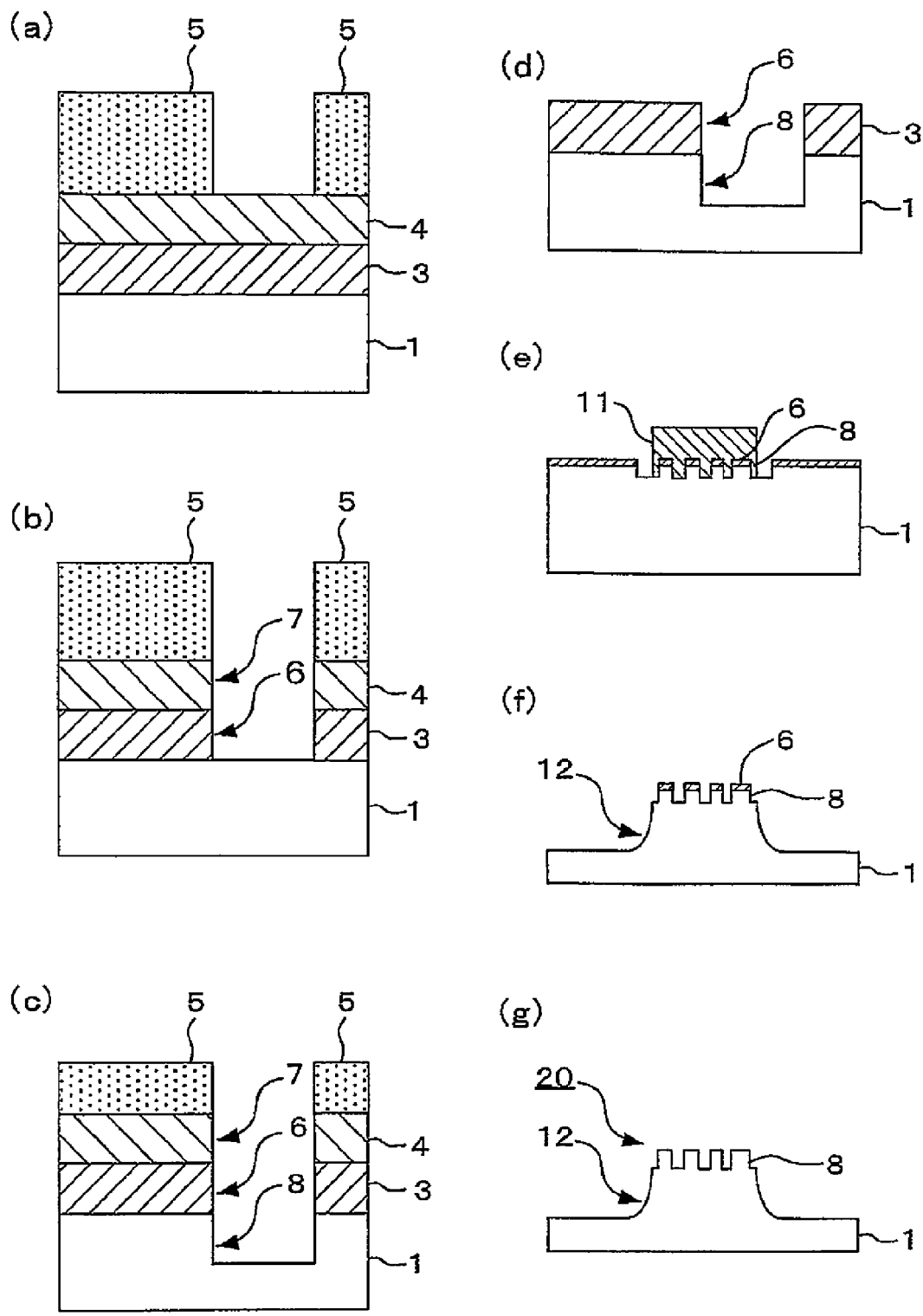
FIG. 2 shows, in (a) to (g), schematic sectional views for illustrating production steps in order of an imprinting mold according to this invention.

FIG. 2 shows schematic sectional views for illustrating production steps of an imprinting mold according to this invention. (a) to (d) in FIG. 2 are enlarged views of parts of (e) to (g) of FIG. 2.

A resist for, for example, electron beam lithography is applied on an upper surface of the mask blank 10 (FIG. 1) according to this invention so as to have a predetermined thickness, and predetermined baking is carried out to form a resist film on the mask blank 10. From the viewpoint of forming a fine pattern having a half pitch (hp) of, for example, less than 32 nm, it is preferable that the thickness of the resist film be not more than 100 nm, more preferably in a range of 40 to 80 nm.

Next, after a desired device pattern is drawn on the resist film on the mask blank 10 using an electron beam lithography apparatus, the resist film is developed to form a resist pattern 5 (see FIG. 2 (a)).

Then, the mask blank 10 with the resist pattern 5 formed thereon is introduced into a dry etching system. By carrying out dry etching using an etching gas containing substantially no oxygen (for example, a chlorine-based gas), the upper layer 4 and the lower layer 3 of the thin film are etched by using the resist pattern 5 as the mask. Thus, a laminated film pattern including an upper layer pattern 7 and a lower layer pattern 6 is formed as illustrated in FIG. 2 (b).

Subsequently, by carrying out dry etching using a fluorine-based (for example, $CHF_3$) gas within the same dry etching system, the transparent substrate (glass substrate) 1 is subjected to etching by using the laminated film pattern including the upper layer pattern 7 and the lower layer pattern 6 as the mask. Thus, a glass pattern (mold pattern) 8 is formed as illustrated in FIGS. 2 (c) and (d).

In addition, at this time, the resist pattern 5 and the upper layer pattern 7 may be left on the lower layer pattern 6 (see FIG. 2 (c)). However, from the viewpoint of eliminating a step of removing these patterns later, the material of the upper layer 4, the thicknesses of the resist and the upper layer 4, and the like are preferably selected in advance so that the resist pattern 5 and the upper layer pattern 7 are simultaneously removed by this dry etching using a fluorine-based gas (see FIG. 2 (d)).

The fluorine-based gas applied to the above-mentioned dry etching according to this invention may be, for example, $SF_6$, $CF_4$, $C_2F_6$, $CH_2F_2$, and $CHF_3$, and mixed gases thereof and He, $H_2$, $N_2$, Ar, $C_2H_4$, $O_2$, or the like. Among others, $CHF_3$ having a high dry etching rate in etching a glass substrate is suitable. The chlorine-based gases applied to the above-mentioned dry etching according to this invention may be $Cl_2$, $CH_2Cl_2$, $SiCl_4$, or the like.

Next, a photoresist is applied onto the mask blank having the glass pattern 8 formed thereon and exposure and development are carried out. In consequence, the photoresist is selectively formed on the lower layer pattern 6 on the glass pattern 8, as illustrated in FIG. 2 (e). The example illustrated in FIG. 2 (e) illustrates a pattern for a base or pedestal structure, and a resist pattern 11 for protecting a region of the glass pattern (mold pattern) 8 is formed.

Then, with regard to the mask blank having the resist pattern 11 formed thereon, the lower layer pattern 6 is removed by, for example, dry etching, except for the portion protected by the resist pattern 11. Then, wet etching of the transparent substrate 1 is carried out to further remove the resist pattern 11. Thus, a base structure 12 as illustrated in FIG. 2 (f) is manufactured.

Further, the lower layer pattern 6 on the glass pattern 8 is removed. Consequently, an imprinting mold 20 having a structure as illustrated in FIG. 2 (g) and which has the mold pattern (glass pattern 8) formed thereon is obtained.

The above-mentioned base structure may be manufactured after the glass pattern (mold pattern) 8 is formed as illustrated in FIG. 2(d) and after the lower layer pattern 6 is entirely removed from the mask blank.

According to this invention, whichever production step is adopted, it is preferable to remove the lower layer (pattern) of the thin film after formation of the glass pattern by bringing the lower layer into contact with a substance which is kept in an unexcited state and which contains a compound of fluorine (F) and any one element of chlorine (Cl), bromine (Br), iodine (I), and xenon (Xe). In the mask blank according to this invention, the lower layer is formed of a material containing at least one of hafnium (Hf) and zirconium (Zr) and containing substantially no oxygen. The lower layer (pattern) which remains after the glass pattern (mold pattern) 8 is formed is easily oxidized because the upper layer 4 has been removed. Thus, the lower layer (pattern) which has been oxidized cannot easily be removed by dry etching using a chlorine-based gas. In the conventional technique, the lower layer (pattern) is removed by dry etching using a chlorine-based gas under a state in which the etching selectivity thereof in relation to the glass pattern 8 is not so high. In this case, the surface roughness of the glass pattern (mold pattern) 8 may be deteriorated or the glass pattern may be damaged. On the other hand, according to this invention, even if oxidation of the lower layer (pattern) has progressed, by bringing the lower layer into contact with a substance which is kept in an unexcited state and which contains a compound of fluorine and any one element of chlorine, bromine, iodine, and xenon, the lower layer can be removed without damage while suppressing deterioration of the surface roughness of the glass pattern already formed. It is to be noted that the pattern inspection is usually made when the above-mentioned glass pattern 8 is formed (at the point of the step illustrated in FIG. 2 (d)). In this case, the result of the pattern inspection shows a good consistency with the mold pattern of the imprinting mold which is finally obtained.

Next, a step of removing the lower layer pattern will be described.

This invention is featured by applying a substance which is kept in an unexcited state and which contains a compound of fluorine (F) and any one element of chlorine (Cl), bromine (Br), iodine (I), and xenon (Xe) (hereinafter simply referred to as a fluorine-based compound according to this invention) in order to remove the lower layer pattern 6 remaining on the glass pattern 8 after the glass pattern is formed.

The lower layer pattern 6 containing at least one of hafnium (Hf) and zirconium (Zr) has excellent etching properties with respect to a substance containing a fluorine-based compound in an unexcited state even under a state in which the oxidation has progressed. On the other hand, the glass substrate used as the transparent substrate 1 has properties that the substrate is easily etched by plasma of a fluorine-based gas in an excited state which is used in dry etching but is hardly etched by a substance containing a fluorine-based compound in an unexcited state. Therefore, high etching selectivity can be obtained between the glass substrate and the lower layer pattern 6 with respect to a substance containing a fluorine-based compound in an unexcited state.

As the above-mentioned fluorine-based compound according to this invention, for example, a compound such as $ClF_3$, $ClF$, $BrF_5$, $BrF$, $IF_3$, $IF_5$, or $XeF_2$ may be preferably used. Among others, in particular, $ClF_3$ may be preferably used in this invention.

It is preferable that the substance containing a fluorine-based compound in an unexcited state be brought into contact in a fluid state, particularly in a gaseous state.

In the step of removing the lower layer pattern 6, as a method of bringing the lower layer pattern 6 into contact with a substance in an unexcited state containing a fluorine-based compound according to this invention, use may preferably be made of a method in which a processed substrate (for the sake of convenience of description, the substrate in a state illustrated in FIG. 2 (d), (e), or (f) is referred to as the "processed substrate") is located in a chamber and the substance containing a fluorine-based compound according to this invention is introduced into the chamber in a gaseous state to substitute the gas for the space in the chamber.

In this invention, when a substance containing a fluorine-based compound according to this invention is used in a gaseous state, use may preferably be made of a mixed gas containing the compound according to this invention and a nitrogen gas or a rare gas such as argon (Ar), helium (He), neon (Ne), krypton (Kr), xenon (Xe), or radon (Rn) (hereinafter, simply referred to as argon or the like).

No specific restrictions are required about the processing conditions, for example, the gas flow rate, the gas pressure, the temperature, and the processing time when the substance containing a fluorine-based compound according to this invention in an unexcited gaseous state is brought into contact with the lower layer pattern 6. However, from the viewpoint of advantageously obtaining the effect and operation of this invention, it is desirable that the conditions be appropriately selected in accordance with the material which forms the lower layer (pattern) and the thickness of the lower layer.

With regard to the gas flow rate, for example when a mixed gas of a compound according to this invention and argon or the like is used, it is preferable that the fluorine-based compound according to this invention be mixed at a flow rate of not less than 1%. If the flow rate of the compound according to this invention is lower than the above-mentioned flow rate, the progress of etching of the lower layer pattern 6 is slow, and, as a result, the processing time becomes longer.

Further, it is preferable that the gas pressure is appropriately selected within a range of, for example, 100 to 760 Torr. If the gas pressure is lower than the above-mentioned range, the amount of the gas of the fluorine-based compound according to this invention within the chamber is too small, and thus, the progress of etching of the lower layer pattern 6 becomes slower, and, as a result, the processing time becomes longer. On the other hand, the gas pressure higher than the above-mentioned range (not lower than the atmospheric pressure) is not preferable because the gas may undesirably flow out of the chamber.

Further, it is preferable that the temperature of the processed substrate be appropriately selected within a range of, for example, 50 to 250° C. If the temperature is lower than the above-mentioned range, the progress of etching of the lower layer pattern 6 becomes slower, and, as a result, the processing time becomes longer. On the other hand, if the temperature is higher than the above-mentioned range, the etching progresses faster, and thus, the processing time may be shortened. However, the selectivity between the lower layer pattern and the glass substrate is difficult to obtain, and the damage of the substrate may be slightly greater.

Further, it is basically sufficient that the processing time is long enough to finish the etching (removal) of the lower layer pattern 6. In the case of this invention, the effect of this invention may be advantageously obtained when the processing time falls within a range of approximately 5 to 300 seconds, although it partly depends on the above-mentioned gas flow rate, gas pressure, temperature, or the material and the thickness of the lower layer pattern.

Figure 3:
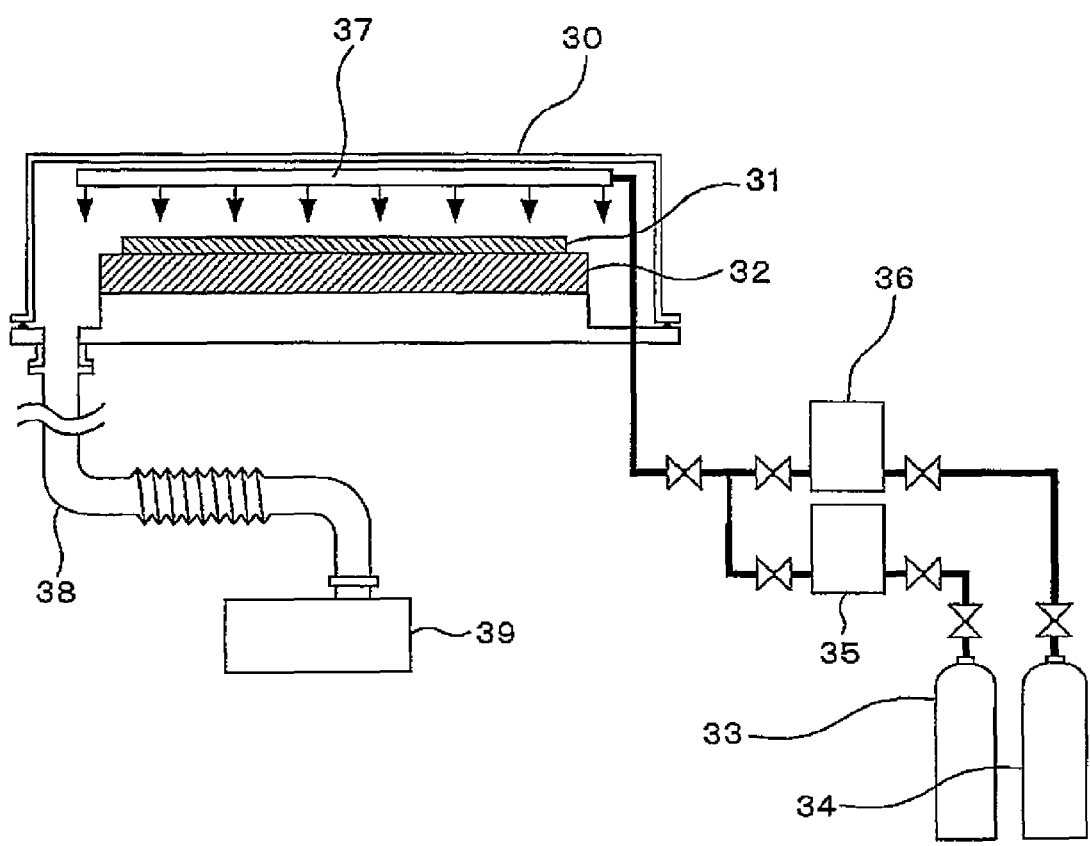
FIG. 3 is a schematic structural view of a processing apparatus used in a step of removing a thin film in manufacturing the imprinting mold according to this invention.

FIG. 3 is a schematic structural view of a processing apparatus suitably used in the above-mentioned step of removing the lower layer pattern.

In the processing apparatus, an unexcited gas supplier is composed of gas-filled containers 33 and 34, flow rate controllers 35 and 36, ejecting nozzles 37, and pipes connecting these components. A processed substrate 31 is located on a stage 32 within a chamber 30 of the processing apparatus. For example, two kinds of gases in the gas-filled containers 33 and 34 are mixed after the flow rates thereof are adjusted by the flow rate controllers 35 and 36, respectively, and the mixed gas is ejected from the ejecting nozzles 37 to be introduced into the chamber 30. Further, the gas in the chamber 30 is exhausted as appropriate via an exhaust pipe 38 by an exhaust pump (gas discharger) 39. When the substance containing a fluorine-based compound according to this invention is used in a gaseous state, the above-mentioned two kinds of gases include the fluorine-based compound according to this invention and a nitrogen gas or a rare gas such as argon or the like.

As described above, the mask blank according to this invention makes it possible to form a fine mold pattern with a high pattern accuracy in manufacturing an imprinting mold. Further, by manufacturing the imprinting mold using the mask blank of this invention, it is possible to form a fine mold pattern of high accuracy. In addition, the thin film pattern formed for the purpose of etching the substrate can be finally removed without any damage of the mold pattern (glass pattern).

EXAMPLES

Now, this invention will be described in detail by way of examples.

Example 1

As illustrated in FIG. 1, a mask blank used in this example has a structure comprising the transparent substrate (glass substrate) 1 and the thin film 2 formed thereon and composed of the laminated film including the upper layer 4 and the lower layer 3. The mask blank is manufactured in the following manner.

As the glass substrate, a synthetic quartz substrate (having a size of approximately 152 mm×152 mm×thickness 6.35 mm) was introduced in a sputtering system, and a target comprising an alloy of tantalum and hafnium (Ta:Hf=80:20 in at % ratio) was sputtered using an argon gas to deposit the lower layer 3 comprising a TaHf film to a thickness of 10 nm. Then, without exposure in the atmosphere, a silicon target was sputtered using an argon gas to deposit the upper layer 4 comprising a Si film to a thickness of 5 nm.

Thus, the laminate film of the TaHf film and the Si film was formed on the quartz substrate to obtain the mask blank 10. On an upper surface of the mask blank, a resist for electron beam lithography (PRL009 manufactured by FUJIFILM Electronic Materials Co., Ltd) was applied to a thickness of 50 nm. Predetermined baking was carried out to form a resist film on the mask blank.

Then, after a line-and-space pattern with a half pitch (hp) of 22 nm was drawn on the resist film of the mask blank by the use of an electron beam lithography apparatus, the resist film was developed to form a resist pattern.

Then, the mask blank having the resist pattern formed thereon was introduced into a dry etching system. By carrying out dry etching using a chlorine gas containing no oxygen, the Si film as the upper layer and the TaHf film as the lower layer were simultaneously etched by using the resist pattern as the mask. Thus, the above-mentioned laminated film pattern including the upper layer pattern and the lower layer pattern as illustrated in FIG. 2 (b) was formed. An endpoint of the etching in this case was determined by using a reflective optical endpoint detector.

Subsequently, dry etching was performed by using a fluorine-based ($CHF_3$) gas within the same dry etching system. Consequently, the glass substrate was etched by using the laminated film pattern as the mask to form a predetermined glass pattern. In this case, the etching time was adjusted so that the depth of the glass pattern was 70 nm. By the dry etching using the fluorine-based gas, the resist pattern disappeared, and the upper layer pattern was simultaneously etched and was almost removed.

At this point, pattern inspection was carried out by a scanning electron microscope (SEM). Then, it was confirmed that an excellent pattern with regard to the dimensions and accuracy of the width and the depth of the glass pattern was formed.

Then, a photoresist (iP3500 manufactured by TOKYO OHKA KOGYO CO., LTD.) was applied to a thickness of 460 nm on the mask blank having the glass pattern formed thereon. Then, exposure and development using ultraviolet light were carried out to form a resist pattern for the base structure.

Then, with regard to the mask blank having the resist pattern for the base structure formed thereon, the TaHf lower layer film was removed by dry etching using a chlorine gas containing no oxygen, except for the portion protected by the resist pattern for the base structure. Then, wet etching of the glass substrate was carried out by using a mixed liquid of hydrofluoric acid and ammonium fluoride (HF concentration of 4.6 wt % and $NH_4F$ concentration of 36.4 wt %), and further, the resist pattern for the base structure was removed by sulfuric acid/hydrogen peroxide mixture. In this manner, the above-mentioned base structure as illustrated in FIG. 2 (f) having a depth of, for example, approximately 15 μm was manufactured.

Then, in order to remove the lower layer pattern remaining on the glass pattern, the above-mentioned processing apparatus illustrated in FIG. 3 was used. Specifically, the substrate having the base structure formed thereon was located within the chamber, and a mixed gas of $ClF_3$ and Ar (flow ratio of $ClF_3$:Ar=0.2:1.8 (SLM)) was introduced into the chamber. By substituting the gas for the space in the chamber, the lower layer pattern remaining on the glass pattern was brought into contact with the mixed gas in an unexcited state. In this case, the gas pressure was adjusted to be 488 to 502 Torr, the temperature of the processed substrate was adjusted to be 195 to 202° C., and the processing time (etching time) was 60 seconds.

In this manner, the lower layer pattern remaining on the glass pattern was removed to obtain the above-mentioned imprinting mold having the structure as illustrated in FIG. 2 (g).

With regard to the obtained imprinting mold, both the pattern of the upper layer and the pattern of the lower layer of the thin film were in a vertical shape in section and were satisfactory. In addition, the pattern accuracy of these patterns was also satisfactory. Therefore, with regard to the glass pattern also, a pattern having satisfactory dimensions and accuracy was obtained. Further, the glass pattern was not damaged after the lower layer pattern was finally removed.

Example 2

This example is an example when this invention is applied to a process of removing a magnetic material of a DTR medium by forming a groove or to an imprinting mold (stamper) to be used in a magnetic pattern forming process of a patterned medium.

In the imprinting mold of this example, use is made of the mask blank is same in structure as the above-mentioned mask blank used in Example 1 illustrated in FIG. 1, except that a disk-like or circular synthetic quartz substrate of a diameter of 150 mm and a thickness of 6.35 mm is used as the transparent substrate.

Hereinafter, description will be made about steps of manufacturing an imprinting mold to be used in a groove forming process of a 2.5-inch DTR medium.

A resist film similar to that of Example 1 was formed on the mask blank. An area surrounded by concentric circles having an outer diameter of 65 mm and an inner diameter of 20 mm, respectively, was defined as a groove pattern forming area. Entire portions of the resist film in an area outside the circle having a diameter of 65 mm and in an area inside the circle having a diameter of 20 mm were exposed by using an electron beam lithography apparatus. Then, a groove pattern having a line width of 40 nm and a space width of 80 nm was exposed in the groove pattern forming area using the electron beam lithography apparatus. Then, the exposed resist film was developed and cleaned by rinsing to form a resist pattern having the groove pattern. It is noted here that the imprinting mold manufactured in this case was of a type used in a transfer process for direct transfer to the resist film on the DTR medium. The pattern on a magnetic recording surface to be finally formed on the DTR medium was a track having a magnetic layer width of 80 nm, a groove width (when the groove is filled with a non-magnetic substance, a non-magnetic layer width) of 40 nm, and a pitch of 120 nm.

Then, the mask blank having the resist pattern formed thereon was introduced into a dry etching system. By carrying out etching using a chlorine gas containing no oxygen, a pattern was formed which comprises a laminated film including a Si film as the upper layer and a TaHf film as the lower layer. An endpoint of the etching in this case was determined by using a reflective optical endpoint detector.

Then, by carrying out dry etching using a fluorine-based ($CHF_3$) gas within the same dry etching system, a quartz glass substrate was etched by using the laminated film pattern as the mask to form a quartz glass pattern. In this case, the etching time was adjusted so that the depth of the glass pattern was 100 nm. For the purpose of confirming the shape of the pattern in section, a blank for evaluation manufactured in the manner similar to that mentioned above was cut and a section of the pattern was observed with a scanning electron microscope. Then, the resist pattern disappeared, the upper layer pattern of the laminated film pattern was also removed, and a surface of the TaHf film as the lower layer was exposed. It was confirmed that the width of the glass pattern formed was almost the same as the width of the pattern of the TaHf film as the lower layer and that the depth of the glass pattern was uniform.

Then, a photoresist (iP3500 manufactured by TOKYO OHKA KOGYO CO., LTD.) was applied to a thickness of 460 nm on the blank having the glass pattern formed thereon in the manner similar to Example 1 and an area outside the circle having a diameter of 65 mm was exposed and developed using ultraviolet light to form a resist pattern for the base structure.

Then, with regard to the blank having the resist pattern for the base structure formed thereon, the TaHf lower layer film was removed by dry etching using a chlorine gas containing no oxygen, except for the portion protected by the resist pattern for the base structure. Then, wet etching of the glass substrate was carried out using a mixture liquid of hydrofluoric acid and ammonium fluoride (HF concentration of 4.6 wt % and $NH_4F$ concentration of 36.4 wt %), and further, the resist pattern for the base structure was removed by sulfuric acid/hydrogen peroxide mixture. In this manner, the base structure having a depth of, for example, approximately 15 μm was manufactured.

Then, in order to remove the lower layer pattern remaining on the glass pattern, the above-mentioned processing apparatus illustrated in FIG. 3 was used in the manner similar to Example 1. Specifically, the substrate having the base structure formed thereon was located within the chamber, and a mixed gas of $ClF_3$ and Ar (flow ratio of $ClF_3$:Ar=0.2:1.8 (SLM)) was introduced into the chamber. The gas pressure, the temperature, and the processing time at this time were set in the manner similar to Example 1.

In this manner, the lower layer pattern remaining on the glass pattern was removed to obtain the imprinting mold to be used in a groove forming process of a DTR medium.

With regard to the obtained imprinting mold, both the pattern of the upper layer and the pattern of the lower layer of the thin film were in a vertical shape in section and were satisfactory. In addition, the pattern accuracy of these patterns was also satisfactory. Therefore, with regard to the glass pattern also, a pattern having satisfactory dimensions and accuracy was obtained. Further, the glass pattern was not damaged after the lower layer pattern was finally removed. Further, this imprinting mold was applied to a groove forming process when DTR media were produced. Then, in each of the DTR media in which a groove was formed, the groove was transferred with high accuracy. Thus, the result was very satisfactory.

Further, in a similar manufacturing process, an imprinting mold (mold having a line width of 25 nm and a groove width of 58 nm) for the purpose of manufacturing a DTR medium having a track pitch of 83 nm was manufactured and an imprinting mold (mold having a line width of 23 nm and a groove width of 10 nm) for the purpose of manufacturing a DTR medium having a track pitch of 33 nm was manufactured. Then, both the dimensions and the accuracy of the patterns were satisfactory. Further, the imprinting mold was applied to a pattern forming process when DTR media were produced. In each of the DTR media in which a groove was formed, the groove was transferred with high accuracy. Thus, the result was very satisfactory.

In a similar manufacturing process, an imprinting mold (mold having a line width of 18 nm and a groove width of 7 nm) for the purpose of manufacturing a patterned medium having a track pitch of 25 nm was manufactured and an imprinting mold (mold having a line width of 20 nm and a groove width of 6 nm) for the purpose of manufacturing a patterned medium having a track pitch of 33 nm was manufactured. Then, both the dimensions and the accuracy of the patterns were satisfactory. Further, the imprinting mold was applied to a pattern forming process when patterned media were produced. In each of the patterned media in which a groove was formed, the groove was transferred with high accuracy. Thus, the result was very satisfactory.

In the examples described above, a two-layer laminated structure including the upper layer 4 and the lower layer 3 was described as the thin film 2. However, this invention is not limited thereto and is also applicable to a structure in which a thin film comprising a greater number of layers is laminated.

DESCRIPTION OF REFERENCE NUMERALS 1 transparent substrate
2 thin film
3 lower layer
4 upper layer
5 resist pattern
6 lower layer pattern
7 upper layer pattern
8 glass pattern (mold pattern)
10 mask blank
11 resist pattern
12 base structure
20 imprinting mold
30 chamber
31 processed substrate
32 stage
33, 34 gas-filled container
35, 36 flow rate controller
37 ejecting nozzle
38 exhaust pipe
39 exhaust pump

The invention claimed is:

1. A method of manufacturing an imprinting mold, comprising:
   obtaining a mask blank comprising a thin film for forming a pattern formed on a transparent substrate, wherein:
   the thin film is brought into contact with a surface of the transparent substrate and comprises a laminated film including at least an upper layer and a lower layer;
   the upper layer is made of a material containing silicon (Si) or a material containing tantalum (Ta); and
   the lower layer is made of a material that contains at least one of hafnium (Hf) and zirconium (Zr) and that contains substantially no oxygen;
   etching the thin film in the mask blank to form a thin film pattern;
   etching the transparent substrate by using the thin film pattern as a mask to form a mold pattern; and
   after formation of the mold pattern, removing the lower layer of the thin film by bringing the lower layer into contact with a substance which is kept in an unexcited state and which contains a compound of fluorine (F) and any one element of chlorine (Cl), bromine (Br), iodine (I), and xenon (Xe).

2. A method of manufacturing an imprinting mold, which uses a mask blank having on a transparent substrate a thin film for forming a pattern,
   wherein the mask blank comprises the thin film brought into contact with a surface of the transparent substrate and the thin film comprises a laminated film including at least an upper layer and a lower layer;
   wherein the upper layer is made of a material that contains silicon and contains substantially no oxygen nor nitrogen, or a material that contains a transition metal and silicon and that contains substantially no oxygen nor nitrogen, the lower layer is made of a material containing at least one of hafnium (Hf) and zirconium (Zr) and containing substantially no oxygen, the method comprising:

processing the upper layer and the lower layer of the thin film by dry etching using a chlorine-based gas by using a resist pattern as a mask to form a pattern; and etching the transparent substrate by using the pattern of the thin film as a mask to form a mold pattern.

3. A method of manufacturing an imprinting mold according to claim 2, further comprising:

after the mold pattern is formed on the transparent substrate, removing at least the lower layer of the thin film by bringing the at least the lower layer of the thin film into contact with a substance that is kept in an unexcited state and that contains a compound of fluorine (F) and any one element of chlorine (Cl), bromine (Br), iodine (I), and xenon (Xe).

* * * * *